United States Patent [19]

Weitzel et al.

[11] 4,131,496
[45] Dec. 26, 1978

[54] METHOD OF MAKING SILICON ON SAPPHIRE FIELD EFFECT TRANSISTORS WITH SPECIFICALLY ALIGNED GATES

[75] Inventors: Charles E. Weitzel, Princeton; David R. Capewell, Browns Mills, both of N.J.

[73] Assignee: RCA Corp., New York, N.Y.

[21] Appl. No.: 860,855

[22] Filed: Dec. 15, 1977

[51] Int. Cl.² .................... H01L 21/86; H01L 27/12
[52] U.S. Cl. .................... 148/175; 29/571;
156/612; 156/613; 156/646; 156/647; 156/655;
156/661; 156/667; 357/4; 357/23; 357/44;
357/49; 357/60
[58] Field of Search ........ 148/175; 156/610, 612–614,
156/646, 647, 655, 661, 667; 29/571; 357/4, 23,
44, 49, 60

[56] References Cited

U.S. PATENT DOCUMENTS

| | | | |
|---|---|---|---|
| 3,471,754 | 10/1969 | Hoshi et al. | 357/49 |
| 3,476,991 | 11/1969 | Mize et al. | 357/23 X |
| 3,493,430 | 2/1970 | Manasevit | 148/175 UX |
| 3,546,036 | 12/1970 | Manasevit | 156/646 |
| 3,652,324 | 3/1972 | Chu et al. | 156/646 X |
| 3,679,502 | 7/1972 | Hays | 156/646 X |
| 3,743,552 | 7/1973 | Fa | 148/175 |
| 3,969,753 | 7/1976 | Thorsen et al. | 358/4 X |
| 4,052,251 | 10/1977 | Weitzel | 156/643 |

OTHER PUBLICATIONS

Maurits, J.E.A., "Problems .... Preparation of SOS Wafers" Solid State Tech., Apr. 1977, pp. 81-86.
Stinson et al., "Sulfur Hexafluoride Etching Effects in Silicon" J. Electrochem. Soc., vol. 123, No. 4, Apr. 1976, pp. 551-555.
Manasevit, H.M., "Gas-Phase Etching of Sapphire IBID., vol. 121, No. 2, Feb. 1974, pp. 293-297.

Primary Examiner—L. Dewayne Rutledge
Assistant Examiner—W. G. Saba
Attorney, Agent, or Firm—H. Christoffersen; D.S. Cohen; Sanford J. Asman

[57] ABSTRACT

The method comprises forming a blind hole in a sapphire substrate using a sulfur hexafluoride gas etchant and an etch mask comprising a single layer of silicon nitride. The blind holes are filled with epitaxially grown silicon and field effect transistors are laid out with their gates orthogonal to a line which is at a 45° angle to a standard wafer flat, i.e. orthogonal to the projection of the "c" axis onto the "r" plane of the sapphire wafer.

11 Claims, 4 Drawing Figures

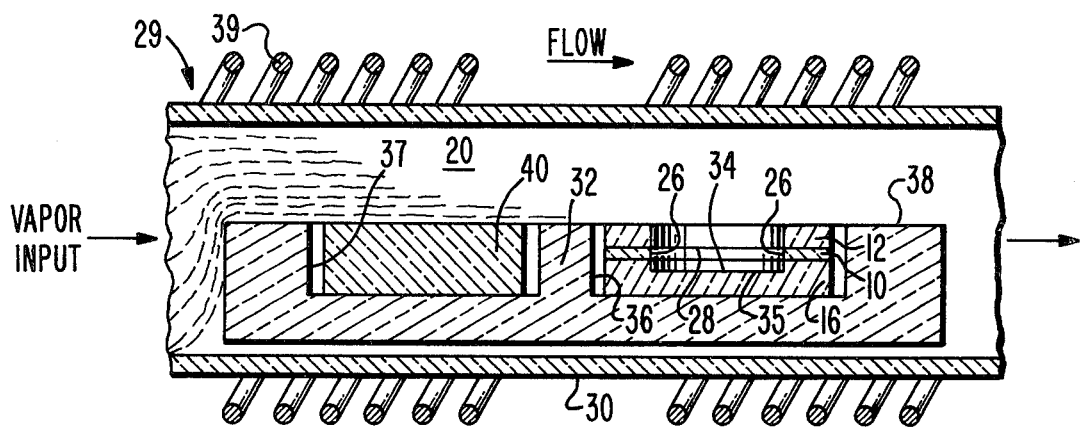
*Fig. 1.*
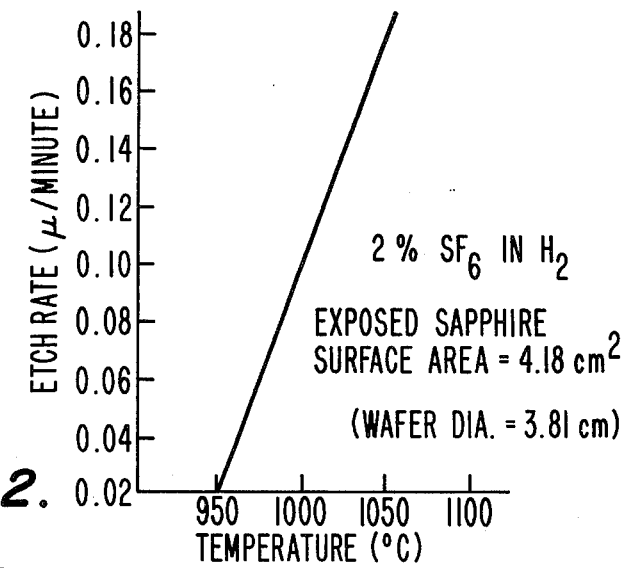
*Fig. 2.*
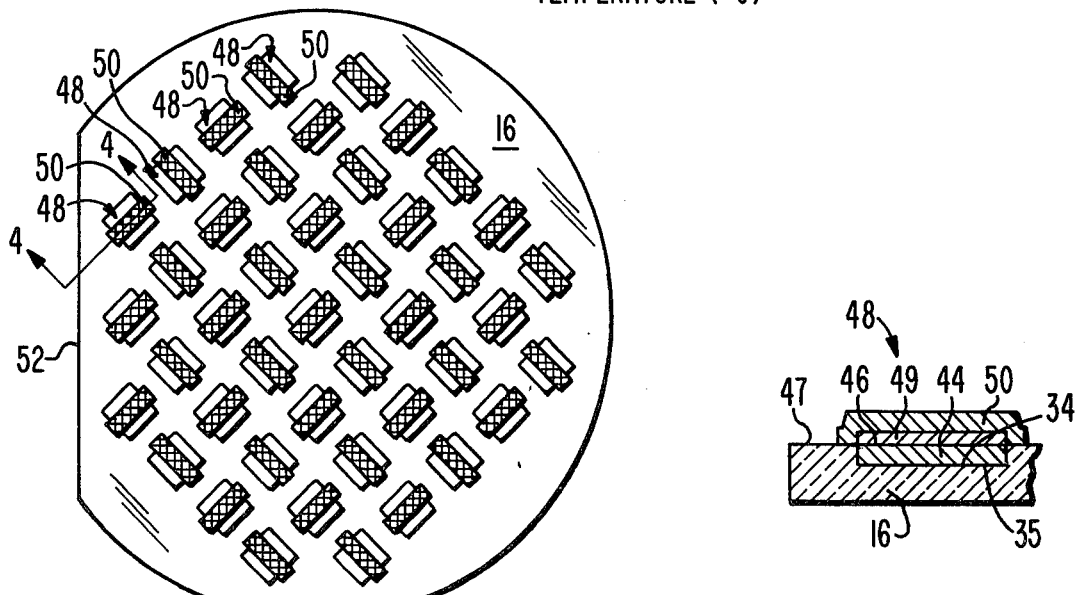
*Fig. 3.*
*Fig. 4.*

METHOD OF MAKING SILICON ON SAPPHIRE FIELD EFFECT TRANSISTORS WITH SPECIFICALLY ALIGNED GATES

The present invention relates to a method of forming field effect transistors using silicon-on-sapphire technology. In particular, the method relates to the formation of substantially planar field effect transistors which are formed in holes etched into a sapphire substrate by using a gaseous mixture of sulfur hexafluoride ($SF_6$) and hydrogen ($H_2$) and a mask which comprises a layer of silicon nitride.

In U.S. Pat. No. 4,052,251 entitled METHOD OF ETCHING SAPPHIRE UTILIZING SULFUR HEXAFLUORIDE which issued on Oct. 4, 1977 to C. E. Weitzel, one of the inventors of the present invention, describes a method of forming blind holes in a sapphire substrate. That patent is incorporated herein by reference. Silicon is epitaxially grown in the holes and semiconductor devices are formed in the epitaxially grown silicon. As described therein, it is possible to use a three layer etch mask comprising a pair of silicon dioxide layers having a silicon nitride layer therebetween for etching the holes using sulfur hexafluoride. At the time that invention was made, it was believed that it was not possible to use a single layer mask comprising only a layer of silicon nitride directly on the sapphire substrate for the formation of blind holes, because field effect transistors which were laid out with their gates orthogonal to the wafer flat, i.e. in the standard layout configuration, on silicon grown in such holes exhibited high edge leakage currents beneath the gates at the silicon-sapphire interface.

In the drawings:
FIG. 1 is a cross section of the apparatus used in the present invention;
FIG. 2 is a graph showing etch rate versus etch temperatures for 2% $SF_6$;
FIG. 3 is a plan view of a portion of a sapphire substrate including a number of field effect transistors (without drain or substrate contacts shown) laid out in accordance with the present method; and
FIG. 4 is a cross section of one of the transistors of FIG. 3 taken along the line 4—4 of FIG. 3.

Referring now to FIG. 4, an insulating substrate 16, comprised of sapphire ($\alpha$-$Al_2O_3$) in the preferred embodiment of the invention, is shown to have a planar field effect transistor (FET) 48 formed in a silicon pocket 44 formed therein. The silicon 44 is preferably epitaxially grown by the reaction of silane with hydrogen in a hole 35 which is formed in the substrate 16 in the manner which is described hereinafter. The transistor 48 further comprises a channel oxide 49 and a conductive gate 50 which may be either aluminum or doped polycrystalline silicon, as would be obvious to one of ordinary skill in the art. The surface 46 of the silicon 44 is substantially planar with the surface 47 of the substrate 16 as the channel oxide 49 is only about 500Å thick.

With reference to FIG. 3, a plurality of transistors 48 are shown formed on the sapphire substrate 16 with their gates 50 aligned either parallel to or perpendicular to a line which forms a 45° angle with the wafer flat 52, i.e. the gates 50 are orthogonal to the projection of the "c" axis on the "r" plane of the substrate 16, as such axis and plane are described in an article by J. E. A. Maurits entitled "Problems and Solutions in the Preparation of SOS Wafers", *Solid State Technology*, Apr. 1977, at pages 81–86. In particular, FIG. 2 of that article describes the projection of the "c" axis onto the "r" plane of the substrate 16. The inventors have found that the transistors 48 will exhibit very low leakage currents at the interface of the substrate 16 and the silicon 44 beneath the gate 50 when the gate 50 is aligned only as heretofore described. While the transistors 48 are shown in FIG. 3 as having a rectangular shape, other shapes such as circular, may be used as long as the gate 50 is aligned as described.

Referring now to FIG. 1, an apparatus used in manufacturing the transistors 48 is shown. The apparatus comprises a rectilinear, hot wall air-cooled reactor 29 having a quartz tube 30 which has a cross section of 5 × 10cm. The reactor 29 is heated by a radio frequency coil 39. Within the reactor there is a graphite susceptor 32 having dimensions of 7.5 × 30 × 1.25cm., for example, in which the gas phase etch of the sapphire substrate 16 is accomplished.

In order to manufacture the transistors 48 one starts with an insulating substrate 16, of sapphire which in the preferred embodiment of the invention has an exposed surface approximately parallel to the [1$\bar{1}$02] plane. The substrate 16 is cleaned by first scrubbing with a commercial soap solution to remove foreign particles and then by using "first standard cleaning solution" which consists of 50% water, 25% hydrogen peroxide and 25% ammonia hydroxide by volume and "second standard cleaning solution" which consists of 50% water, 25% hydrogen peroxide and 25% hydrochloric acid, by volume.

The substrate 16 is first boiled in first standard cleaning solution for about 10 minutes, and then it is boiled in second standard cleaning solution for about 10 minutes. The first standard cleaning solution removes grease and the second standard cleaning solution removes metal contaminants from the substrate 16 which is then dried by any means known in the art.

To further insure the cleanliness of the substrate 16 prior to subsequent processing steps, and to prevent any other chemical reaction which could upset the protection afforded by the etch mask which is to be described, the substrate 16 is annealed in palladium-diffused hydrogen gas at 1200° C. for about 30 minutes. Next, a silicon nitride layer 10 is deposited on the substrate 16 preferably by the reaction of silane ($SiH_4$) with nitrogen $N_2$ and ammonia ($NH_3$). The silicon nitride deposition is typically performed in a "pancake style" reactor in which 500Å of silicon nitride can be deposited in 3½ minutes at 800° C.

The inventors have discovered that a single layer of silicon nitride 10 can be used as the etch mask for forming holes 35 in the sapphire substrate 16. However, in the preferred embodiment of the invention, an oxide layer 12 having a thickness of preferably at least 2000Å is used in addition to the nitride layer 10. Therefore, in accordance with the preferred embodiment of the invention, a silicon dioxide layer 12 is deposited on the silicon nitride layer 10 by the reaction of silane with oxygen.

Next, a photoresist layer is applied on the exposed silicon dioxide layer 12 and the photoresist layer is selectively defined and developed for use as an etch mask for the silicon dioxide layer 12 which is etched in a solution of buffered hydrofluoric acid. The photoresist layer is then removed in Caro's acid, which is a solution of hydrogen peroxide and sulfuric acid. The silicon nitride layer 10 is etched using the silicon dioxide layer 12 as an etch mask, preferably in concentrated phosphoric acid at a temperature of 180° C. to form an aperture 26 through which the substrate 16 is exposed.

As an alternative to the method described above for forming the aperture 26 in the silicon nitride layer 10 where no silicon dixoide layer 12 is to be used, a photoresist layer can be applied directly over the silicon nitride layer 10. After that photoresist layer is defined and developed the silicon nitride layer can be etched in a plasma etcher which uses rf power to excite a carbon tetrachloride (CF$_4$) plasma which will etch the silicon nitride layer 10 without affecting the photoresist. Following the formation of the aperture 26 the photoresist layer is removed from the silicon nitride layer 10.

The inventors have found that it is preferable to use the silicon dioxide layer 12 in order to minimize the probability of roughening and pitting of the bottom 34 of the hole 35 formed in the substrate 16. However, it is not necessary to the invention to use the silicon dioxide layer 12.

Following the formation of the aperture 26 first and second standard cleaning solutions are reapplied and processing steps associated therewith and described above are again performed. It is preferable, at this time, to "densify" the oxide and nitride layers 12, 10 in order to make them more resistant to attack by the etchant gas. Densification may be accomplished by heating in helium at 1050° C. for 15 minutes.

Referring again to FIG. 1, the substrate 16 having the silicon nitride and silicon dioxide layers 10, 12 thereon (or having only a silicon nitride layer 10 thereon as described above) is placed in a recess 36 in a graphite susceptor 32 such that the surface of the oxide layer 12 (or of the nitride layer 10 if no oxide is used) is flush with a surface 38 of the susceptor 32. The diameter of the recess 36 should be only slightly larger than the diameter of the substrate 16 in order to prevent turbulence in the gas flow, so the recess should be approximately 12 mils deep, i.e. the approximate thickness of a 1½ inch diameter sapphire substrate 16. As an aid in assuring that the bottom 34 of the blind hole 35 formed in the sapphire substrate 16 is uniform and smooth a dummy substrate 40 is placed in a recess 37 in the susceptor 32 upstream of the substrate 16 which is to be etched.

Prior to starting the gas phase etching, the reactor 29 is flushed with nitrogen gas to remove any air in the reactor. The nitrogen is then removed by flushing with palladium-diffused hydrogen. Then the susceptor 32 is heated to the desired etch temperature by using radio frequency coils 39. The temperature can be determined by using an optical pyrometer (not shown) which is focused on the susceptor 32.

The gas phase etching of the substrate 16 is accomplished in the reactor 29 by flowing an etchant vapor 20 comprising a mixture of 2% by volume sulfur hexafluoride preferably having a purity of 99.995% and 98% palladium diffused hydrogen preferably having a purity of at least 99.999% at a temperature between about 900° C. and 1100° C. It is preferable to limit the temperature to below about 1050° C. in order to avoid a rough or pitted bottom surface 34. The flow rate of the vapor 20 is generally maintained at between 10 and 50 liters per minute.

The etch rate of the sapphire substrate 16 may be determined from the plot shown in FIG. 2 of the etch rate vs. temperature for the mixture described above.

The process is most preferably performed at 1000° C. For a sapphire substrate of diameter 3.81 cm and exposed sapphire surface area of 4.18 cm$^2$, a 0.8 micrometer deep hole is etched in 10 minutes using a 2% concentration of sulfur hexafluoride. It is possible, however, to vary the etch rate by using a concentration of sulfur hexafluoride comprising ½% to 4% of the mixture.

Following the etching of the substrate 16 the sulfur hexafluoride flow is turned off and the substrate 16 is allowed to cool to a lower temperature while the palladium-diffused hydrogen gas continues flowing through the reactor 29. Any remaining hydrogen gas is flushed from the reactor 29 by displacing it with nitrogen gas. After that has been accomplished the substrate 16 is removed from the reactor 29.

Following the formation of the blind holes 35 in the substrate 16 by the preferred embodiment of the invention, a portion of the silicon dioxide layer 12 which has been exposed to the gas etchant 20 will be etched away. The balance of the silicon dioxide and silicon nitride layers 12, 10 are removed by etching in a solution comprising 50% nitric acid and 50% hydrofluoric acid. Next, the first and second standard cleaning solutions are reapplied as heretofore described. Then, the sapphire substrate 16 is annealed in a hydrogen atmosphere.

Referring now to FIGS. 3 and 4, the completed sapphire substrate 16 has epitaxially grown silicon 44 formed within the holes 35. The silicon 44 can be epitaxially grown by the reaction of silane with hydrogen. Thereafter, the silicon 44 can be lapped or ground so that the surface 46 of the silicon 44 is substantially planar with the surface 47 of the sapphire substrate 16. Subsequently, the substrate 16 is polished to provide a smooth mirror-like surface which is used for the formation of field effect transistors 48.

The transistors 48 (which are shown only with their gates 50 in place) may be formed by any method known in the art, bearing in mind that the surface of the transistors 48 will be substantially coplanar with the surface of the substrate 16 when formed. For example, the process described by A. C. Ipri, et al in an article entitled "Low-Threshold Low-Power CMOS/SOS For High-Frequency Counter Applications", *IEEE Journal of Solid State Circuits*, Vol. SC-11, No. 2, Apr. 1976, at pages 329–334, may be used in forming the transistors 48. It is critical to the invention that the gates 50 of the transistors 48 be aligned either parallel to or perpendicular to the projection of the "c" axis onto the "r" plane of the substrate 16, i.e. orthogonal to a line which forms a 45° angle with a standard wafer flat 52.

While the present invention has been described with regard to a sapphire substrate, the inventors believe that other insulating materials, such as spinel or beryllium oxide, can be used instead of sapphire. When sapphire is used, the substrate referred to herein will generally take the form of a wafer of sapphire, as will be obvious to one of ordinary skill in the art.

What is claimed is:

1. A process for manufacturing field effect transistors on an insulating substrate selected from the group consisting of sapphire, spinel and beryllium oxide; comprising:
   (a) depositing a mask comprising a layer of silicon nitride directly on an exposed surface of said insulating substrate;
   (b) defining an aperture in said mask to expose portions of the underlying insulating substrate;

(c) exposing said mask and said exposed portions of said insulating substrate to a gas mixture comprised of sulfur hexafluoride gas and a carrier gas at a temperature less than 1050° C. for a time period sufficient to form blind holes in said insulating substrate;

(d) epitaxially growing silicon in said blind holes; and (e) forming field effect transistors in said epitaxially grown silicon, the gates of said field effect transistors being aligned orthogonal to the projection of the "c" axis on the "r" plane of said insulating substrate.

2. The process of claim 1 wherein said insulating substrate is a sapphire substrate having a surface orientation substantially parallel to the [1$\bar{1}$02] crystallographic plane.

3. The process of claim 2 wherein said aperture is defined in said mask by plasma etching said silicon nitride layer.

4. The process of claim 2 further comprising depositing a layer of silicon dioxide on said layer of silicon nitride wherein the step of defining an aperture comprises defining said aperture also in said silicon dioxide layer.

5. The process of claim 4 wherein the carrier gas is hydrogen.

6. The process of claim 5 wherein sulfur hexafluoride comprises from ½% to 4% of the volume of the mixture.

7. The process of claim 6 wherein said silicon nitride is deposited to a thickness of at least 500Å.

8. The process of claim 7 wherein said silicon dioxide layer has a thickness of at least 2000Å.

9. The process of claim 8 wherein the gas mixture has a flow rate over the substrate of from 10 to 50 liters/minute.

10. The process of claim 9 wherein the substrate is exposed to the gas mixture for a time period of between 3 and 10 minutes.

11. The process of claim 10 wherein the substrate with the mask thereon is heated to less than 1050° C. by a radio frequency coil positioned around a reactor housing the substrate.

* * * * *